(12) United States Patent
Holung et al.

(10) Patent No.: US 7,086,291 B2
(45) Date of Patent: Aug. 8, 2006

(54) OVERSTRESS INDICATION

(75) Inventors: Joseph Anthony Holung, Wake Forest, NC (US); Noboru Kodama, Kanagawa-ken (JP); Tin-Lup Wong, Chapel Hill, NC (US)

(73) Assignee: International Business Machines Corporation, Armonk, NY (US)

( * ) Notice: Subject to any disclaimer, the term of this patent is extended or adjusted under 35 U.S.C. 154(b) by 47 days.

(21) Appl. No.: 10/835,030

(22) Filed: Apr. 29, 2004

(65) Prior Publication Data
US 2005/0241401 A1    Nov. 3, 2005

(51) Int. Cl.
*G01B 11/16*    (2006.01)
(52) U.S. Cl. ........................................... 73/762
(58) Field of Classification Search ........... 73/762–800
See application file for complete search history.

(56) References Cited

U.S. PATENT DOCUMENTS

| | | | |
|---|---|---|---|
| 4,318,936 A * | 3/1982 | Moss et al. ................ | 438/53 |
| 5,702,847 A * | 12/1997 | Tarumoto et al. .............. | 430/5 |
| 6,309,975 B1 * | 10/2001 | Wu et al. .................... | 438/705 |
| 6,675,476 B1 * | 1/2004 | Hostetler ................... | 29/890.1 |

OTHER PUBLICATIONS

"Principles of Stresscoat® Brittle Coating Experimental stress analysis," *StressCoat*, pp. 1-12.

* cited by examiner

*Primary Examiner*—Max Noori
(74) *Attorney, Agent, or Firm*—Daniel E. McConnell

(57) ABSTRACT

Devices and their subassemblies typically undergo stresses during manufacturing and testing processes and during general use. To provide visual indication of stress or strain levels endured, a preferred embodiment includes frangible material deposited on particular isolated areas of devices and/or their subassemblies. The frangible material, when applied according to one methodical embodiment, provides visible indication of overstrain as cracks in the frangible material deposits, and of non overstrain when cracks are not visible.

16 Claims, 6 Drawing Sheets

OVERSTRESS INDICATION

BACKGROUND OF THE INVENTION

This invention pertains to devices and methods of making devices having overstress indicators thereon. This invention is beneficial to devices which undergo stresses during manufacturing and testing processes and during general use. More particularly, the invention pertains to a computer system or a subassembly thereof, and methods of making such, wherein visual indication of stress is provided by simple inspection.

Overstrain caused by overstress to solder joints on Ball Grid Array (BGA) and other high pin-count electronic packages during manufacturing and customer usage has caused serious premature system failure and customer impact on systems ranging from servers to laptop computers. Overstress conditions are usually caused by insufficient mechanical support in in-circuit testing (ICT), card functional testing, system integration, and assembly. For mobile computer applications, rough handling by customers can also induce this type of failure to solder joints. Typically, overstress to the BGA part is evident from hairline cracks between the solder ball and the chip substrate or between the solder ball and the printed circuit board (PCB). In general, the damage to solder joints produces microcracks at the inter-metallic interfaces which are largely undetectable in normal manufacturing test processes.

A number of advanced non-destructive methods such as eddy-current tests, electric current tests, and ultrasonics, among others, are available for detecting the surface crack. The eddy-current test can only be applied to conductive materials and masked or false indications are possible due to sensitivity to part geometry and permeability variations. The electric current test is sensitive to surface contamination, edge effects and electrode spacing. Ultrasonic techniques are difficult when applied to small, thin, complex parts and require special probes. Trained operators, specialized equipment, increased complexity and cost, and the ability to automate the process are among other disadvantages of these methods.

One destructive test method, such as a dye penetration method, can also be used. In this approach a red dye is injected at the solder joints of the BGA package and the BGA is pulled off the board and the cross section site is inspected under microscope for evidence of solder joint crack. A similar approach involves taking cross-sectional cuts through the BGA package and examining these encapsulated metallurgical samples for evidence of cracking using a scanning electron microscope or other high magnification microscope in the range of 2000×. These destructive approaches are time-consuming, expensive, and require highly specialized equipment and personnel.

Clearly there is a need for a simpler approach to detect these microcracks, an approach that avoids the disadvantages of the current methods.

SUMMARY OF THE INVENTION

A straightforward visual indication based on application of frangible coating technology to specific areas of a device or a subassembly thereof, such as a circuit board substrate, is disclosed.

A device, a flexible component thereof, or a subassembly thereof, such as a circuit board substrate having a component mounted thereon, includes frangible material deposited to a specific area or to specific areas thereof.

In one embodiment including a circuit board substrate having a component mounted thereon, the frangible material is deposited on the substrate approximal to the component to a predetermined area. The area is smaller than the largest area of the component and is surrounded by non frangible material.

In one methodical embodiment, frangible material is deposited to selected portions of a workpiece having a substrate and a component mounted on the substrate. The frangible material is deposited to a predetermined area of the substrate approximal to the component. The area of frangible material is preferably smaller than the largest area of the component and is surrounded by non frangible material. The workpiece is subjected to at least one procedure which exerts strain on the workpiece. Typically, the procedure is a manufacturing procedure or a testing procedure of some kind but can also include field applications including shipment to customers. At any point in the procedure, the workpiece is then visually inspected. If cracks are visually evident, the workpiece is removed from at least a second procedure.

BRIEF DESCRIPTION OF THE DRAWINGS

Some of the purposes of the invention having been stated, others will appear as the description proceeds, when taken in connection with the accompanying drawings, in which.

DETAILED DESCRIPTION OF THE ILLUSTRATIVE EMBODIMENTS

Figure 1:
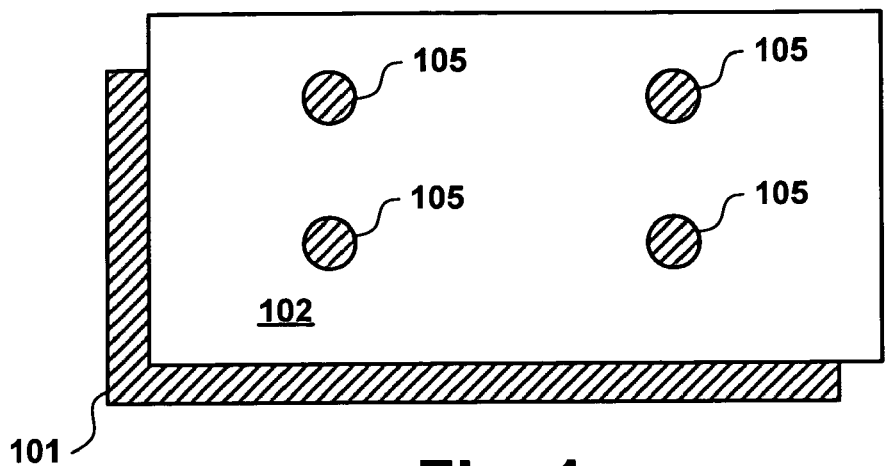
FIG. 1 depicts the preferred method of applying the frangible material to a substrate.

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of this invention. Accordingly, the description which follows is to be understood as being a broad, teaching disclosure directed to persons of skill in the appropriate arts, and not as limiting upon the present invention.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

According to embodiments of the present invention, a stress and/or strain sensitive frangible or brittle coating is applied to a device, a flexible component thereof, or a subassembly thereof. Examples of such a subassembly include a printed circuit board substrate having a component chip mounted thereon, or a circuit board substrate which is unpopulated but is to have component mounted thereon. When applied to a printed circuit board, for example, the frangible material is preferably deposited at selected locations on printed circuit board near chip locations to monitor stresses. If overstress occurs, cracks would run in a direction perpendicular to the principal stress in the underlying card revealing the stressed area and the direction of normal stress—information that could also be useful in more detailed failure analyses. Usually, high mechanical stresses are found at the corners of a ball grid array (BGA) package, therefore these corner areas are the primary targets for applying the frangible coating. Generally speaking, however, the location of the frangible coating deposition can be predetermined either empirically as above or by stress/strain computer simulations and the like. Details concerning stress/strain computer simulations are well known in the art and are omitted so as to not obfuscate the present disclosure in unnecessary detail.

Depending on the type of coating material, thickness etc., different strain levels can be detected, e.g., 300, 500 or 1000 microinches per inch. The currently allowable strain threshold in the personal computing technology area for certain computing devices and their constituent printed circuit boards is around 600 microinches per inch of strain peak to peak. However, this value is expected to change as the underlying technology changes and is not intended for purposes of limitation to the scope of the invention. The embodiments described herein provide simple, non-destructive, and cost effective ways to indicate if a critical component has ever been subjected to any overstress condition.

In many practical applications it is unnecessary to measure the direct strain history itself; it is only necessary to establish that a certain strain threshold has been exceeded. For these applications the frangible deposition procedure is useful as well, revealing that the threshold has been exceeded from the visual cracks in the coating. It is envisioned that the coating can be applied in any number of suitable methods such as adhesive bonding, direct spray or printing, and other coating processes including silkscreening which is popular in the printed circuit board industry. For the most part, details concerning coating processes and the like have been omitted in as much as such details are not necessary to obtain a complete understanding of the present invention and are within the skills of persons of ordinary skill in the relevant art.

The chemical composition and formulation and the thickness of the applied coating determines its fragility behavior. Therefore, different coatings will yield different fracture levels and one can either procure a suitable family of coatings or tailor specific coatings to yield a suitable range of fracture levels for particular applications. For example, Stresscoat® (mark owned by the Magnaflux Corporation) is the tradename of one of the most popular coatings that can be commercially obtained in a range of compositions and is thin enough to be sprayed. This coating is normally sprayed on a clean surface to a thickness of 0.004 to 0.008 inch and has a threshold strain in the range of 600 to 800 microinches per inch. This range is suitable for printed circuit manufacturing applications monitoring.

Referring now more particularly to the accompanying drawings, in which like numerals indicate like elements or steps throughout the several views, a preferred embodiment of the present invention will be described.

FIG. 1 depicts the preferred method of applying the frangible material to a substrate. A printed circuit board substrate 101 is first masked and the frangible material is sprayed. Solid areas 103 of mask 102 prevent the spray from coming into contact with printed circuit board 101. Hollow areas 105 of the mask 102 allow the spray to come into contact with the printed circuit board 101 and are placed at predetermined positions corresponding to those areas where strain is expected on printed circuit board 101. Mask 102 is then removed leaving only the areas of frangible material. With the spray application method, the thickness of the frangible material is controlled by the amount of time the spray nozzle is activated over a given area. The use of mask 102 allows for non-precision spraying over the entire area of the substrate for the entire area surrounding and encompassing hollow areas 105.

n one embodiment, as an alternative to the masking described above, precision robotics can be utilized for precision placement and spraying of the frangible material. This type of application requires that the spray nozzle be close enough to the workpiece that over spray does not significantly affect other areas which are intended to be devoid of frangible material.

Figure 2:
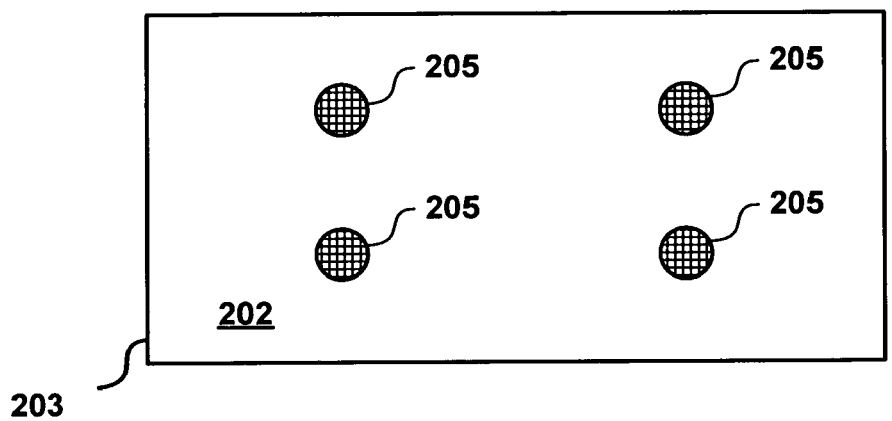
FIG. 2 shows an alternative method of applying the frangible material to a substrate.

FIG. 2 shows an alternative method of applying the frangible material to a substrate. A silkscreen 202 is placed directly atop of the printed circuit board substrate (not shown) and the frangible material is applied to the entire area shown in FIG. 2 according to any silkscreening process known to one skilled in the art. Alternatively, rather than applying material to the entire area, material can be applied to subsections of the silkscreen encompassing several permeable areas of the silkscreen. With the silkscreen method, the thickness of the frangible material is determined by its fluid properties including its viscosity and the material is formulated to have a higher viscosity than for the sprayed material. For silkscreening, the frangible material is of sufficient viscosity to resist running or bleeding when applied. Solid areas 203 of the silkscreen 202 prevent the material from penetrating through the screen when applied. Porous areas 205 of silkscreen 202 allow the frangible material to come into contact with the desired areas of the printed circuit board positioned directly underneath. The known silkscreening processes described in relation to FIG. 2 require that the printed circuit board be mostly or entirely unpopulated.

Figure 3:
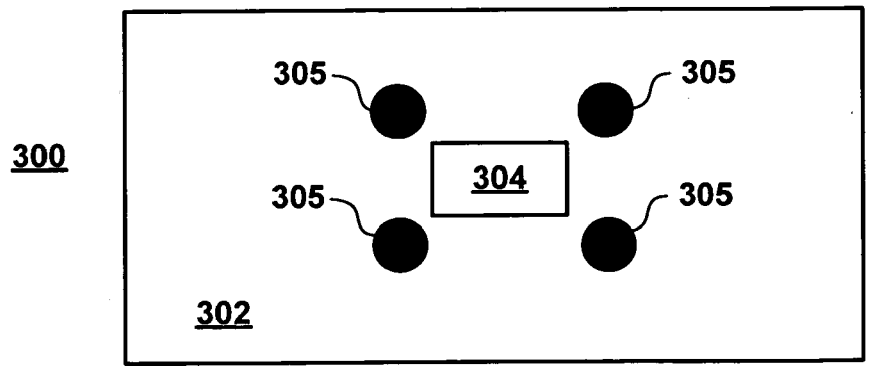
FIG. 3 shows a populated printed circuit board having frangible material deposited on at least one predetermined area approximal to a component according to one embodiment of the present invention.

FIG. 3 shows a populated printed circuit board having frangible material deposited on at least one predetermined area approximal to a component according to one embodiment of the present invention. Printed circuit board substrate 302 includes a ball grid array component 304 which makes electrical connections to circuit board 302 through an array of solder balls, rather than pins, directly between complementary contacts on both the component 304 and printed circuit board substrate 302. In this arrangement, it is known that the area of substrate 302 directly underneath component 304 is not supported and, therefore, it is expected that the solder balls at the corners of component 304 are under the highest amount of stress and are expected to crack before other solder balls. A broken solder ball gives rise to either an open circuit or an intermittent circuit, both of which are undesirable. Areas of frangible material 305 have been applied according to either of the application methods described in relation to FIGS. 1 and 2. As the assemblage 300 is passed from one manufacturing process to another, such as solder reflow and testing, it is desirable to know whether or not the assemblage 300 has endured a maximum peak to peak value of strain which is greater than 600 microinches per inch. Values higher than 600 microinches per inch of strain are expected to crack the solder balls. The material 305 is therefore applied such that it cracks at a threshold value of 600 microinches per inch of strain. For example, if the material used is Stresscoat®, the material is deposited to a thickness of 0.004 inches yielding a threshold strain of 600 microinches per inch.

Assemblage 300 of FIG. 3 shows the material 305 applied on the same side of substrate 302 as component 304. In one embodiment, the material is deposited below the ball grid array chip 304 on the opposite side or underside of substrate 302. Depositing the frangible material on the underside of substrate 302 is workable because both the underside and the upper side experience similar strain levels. Under load, the material 305 would first begin to crack at its threshold sensitivity. With this coating applied to the unpopulated cards, a quality inspection of the stress coating following card assembly would then quickly reveal an errant assembly process.

The embodiment of FIG. 3 shows how the stress coating could be used as an important indicator of the manufacturing assembly and testing process. Furthermore, abuse or unanticipated overloading after the product has been in service is revealed from a visual inspection of the stress coating on the card. Accordingly, a stress-coating as applied above, or multiple applications of different coatings on the same assembly, are a useful diagnostic and control tool for the quality organization.

It has been discovered that the frangible material is preferably deposited to specific predetermined areas, such as those area shown as 305 of FIG. 3, rather than applied to an entire area of a circuit board substrate such as 302. Areas 305 are preferably smaller than component 304 such that they are surrounded by non frangible material such as circuit board material or surface metal.

Figure 4:
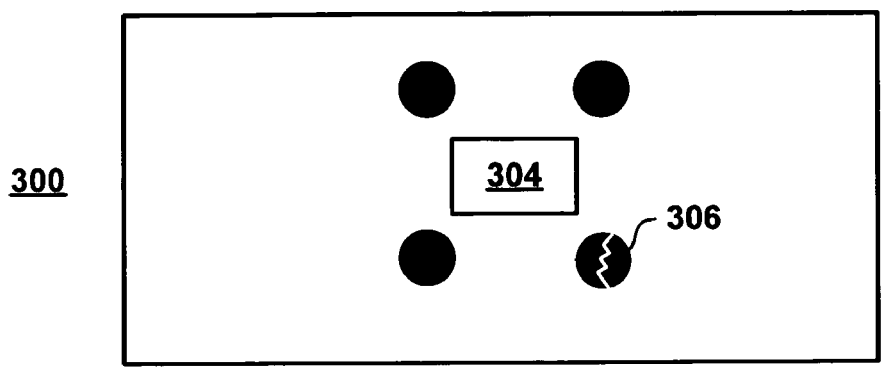
FIG. 4 shows the assemblage of FIG. 3 which has been subjected to a strain value which is greater than the threshold value of the frangible material.

FIG. 4 shows the assemblage 300 of FIG. 3 which has been subjected to a strain value which is greater than the threshold value of the frangible material 306 and, accordingly, visibly reveals a crack or fracture. The crack is typically perpendicular to the stress forces.

Figure 5:
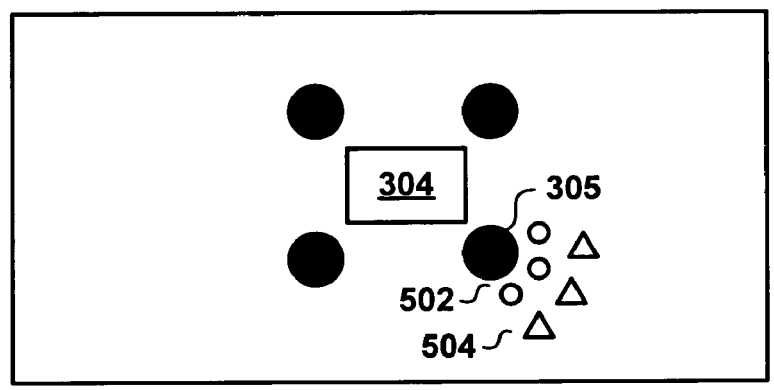
FIG. 5 illustrates one embodiment in which various areas of frangible material are used per area of interest.

FIG. 5 illustrates one embodiment in which various areas of frangible material are used per area of interest. Where more information about a particular area is desired, such as a particular corner, a plurality of areas of frangible material may be deposited as shown in FIG. 5. In addition to deposition 305, or in lieu thereof, the plurality of frangible coating areas shown as smaller circles 502 and triangles 504 are deposited on a substrate. This arrangement can be used, for example, where the nature of the stresses are not well understood and where failures are occurring in a given area at a higher rate than other areas. The arrangement shown can be used for one or more of the corners of ball grid array device 304. Smaller circular areas 502 are isolated from each other and from other areas of frangible material by non frangible material. Triangular areas 504 are also isolated from each other and from other frangible material areas and are preferably deposited such that the frangible material cracks at a different threshold than that of areas 502. Depending on the stress profile, the threshold for areas 504 may be less than or greater than the threshold for areas 502. For example, if the stress is expected to be increasing as the distance to area 305 approaches zero, i.e., the stress is maximal at area 305, then the threshold for areas 502 is preferably greater than the threshold for areas 504. Areas 502 and 504 provide directional information and magnitude information by simple visual inspection of which of the plurality of areas is cracked or not cracked. Each area of frangible material breaks in response to experiencing a value of strain which is greater than its strain threshold. At greater distances, areas 504 experience a different magnitude levels than areas 502. Detailed information related to magnitude is therefore given by areas 504 which are located at a distance which is further from the center of component 304 than areas 502. In like manner, each of areas 502 and 504 are displaced radially from each other relative to the center of component 304. Since each lies at a different angle relative to the center of component 304, directional information is derived by simple visual inspection and notation of which of areas 504 and 502 have cracked.

Figure 6:
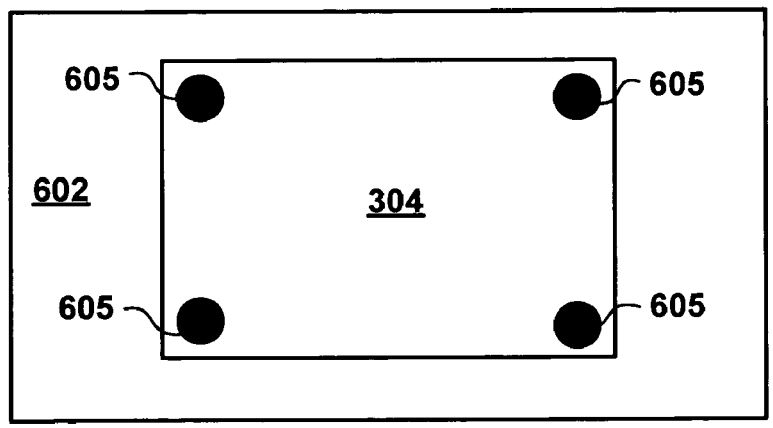
FIG. 6 depicts one embodiment in which frangible material is deposited on a component rather than on a substrate.

FIG. 6 depicts one embodiment in which frangible material is deposited on a component rather than on a substrate. In certain circumstances, it is preferable to apply the frangible material directly to component 304 shown in FIG. 6. These circumstances include, for example, scenarios in which stress forces are applied directly to component 304, and/or when component 304 is as flexible or more flexible than substrate 602. In these scenarios, and the like, frangible material 605 is deposited directly on component 304. Alternatively, frangible material may be applied to both component 304 and substrate 602 when information related to the stress profile of both are required.

Figure 7:
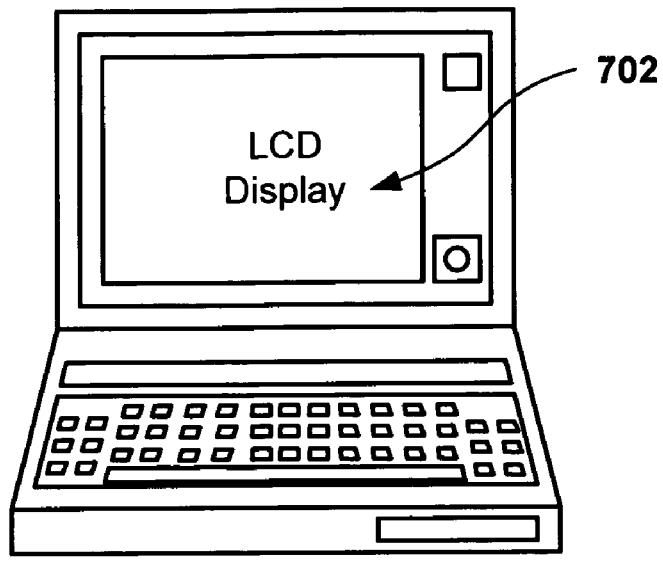
FIG. 7 is a perspective view of a laptop computer having an LCD display.

FIG. 7 is a perspective view of a laptop computer having an LCD display. As will be described in the discussion which follows, frangible material is deposited on the back side of the LCD display 702. Generally, however, frangible coating can be applied to any portion of the computer— passive or active—which is expected to meet with large stresses in either the manufacturing process or in the field. Preferably, the material is applied to fragile components which are costly.

Figure 8:
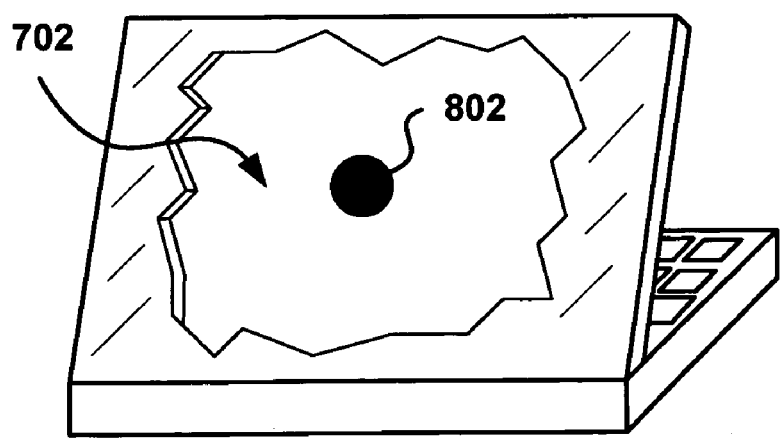
FIG. 8 is a rear-inside view of the back of the LCD display of FIG. 7 showing frangible material deposited thereto according to one embodiment of the present invention.

FIG. 8 is a rear-inside view of the back of the LCD display of FIG. 7 showing frangible material deposited thereto according to one embodiment of the present invention. Frangible material 802 is preferably placed at the center, or maxima, of the expected strain. The coating or deposition of frangible material can be uniform or can have various structures to be described in the description of FIGS. 9–12, which ensue. When the frangible material is placed at the center of the strain profile, information as to the magnitude and direction of the strain can be determined by visual inspection of the crack in the frangible material once stressed beyond its breaking threshold. When applied as the same as a uniform coating having one threshold surrounding the maxima, the fracture will occur at the center and propagates outward to a distance such that the strain just falls below the threshold value.

FIGS. 9–12 show alternate structures of frangible coating 802 which are useful when more information or alternative information is needed over that which the uniform coating will provide.

Figure 9:
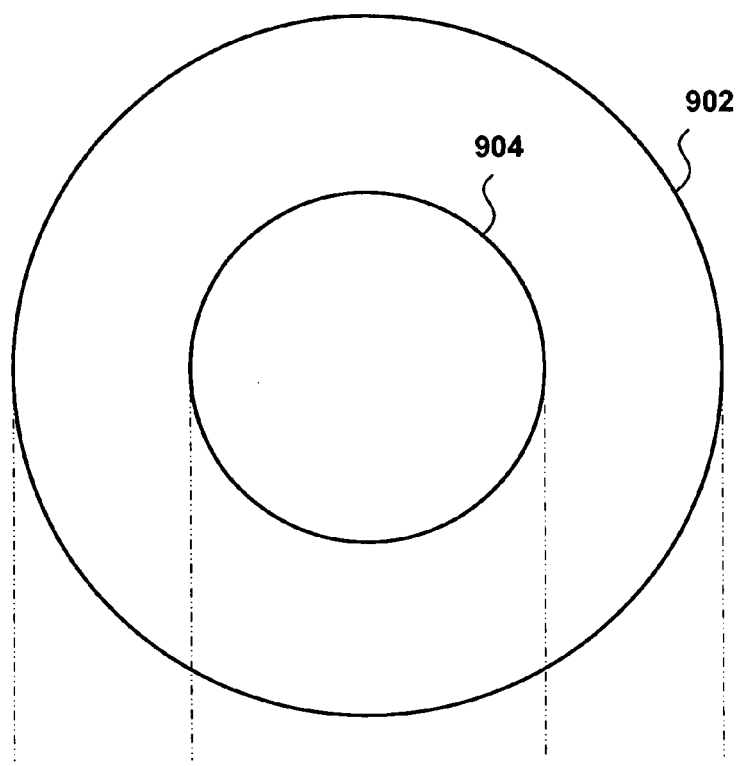
FIG. 9 is an isolated view of the material deposited to the back of the LCD display shown in FIG. 7 as viewed from a point which is perpendicular to the back of the LCD according to one embodiment of the present invention.

FIG. 9 is an isolated view of the material deposited to the back of the LCD display shown in FIG. 7 as viewed from a point which is perpendicular to the back of the LCD according to one embodiment of the present invention. The deposition of material shown in FIG. 9 is applied as two layers 902 and 904 of frangible material. Area 904 is deposited as a second layer which has a greater thickness than the first area 902. This structure is used when the frangible material breaking threshold varies as a function of deposition thickness and where it is desirable to record a broader dynamic range of strain values. The lower strain threshold of area 902 allows the crack to propagate further, and by virtue of the different areas traversed, deduce its magnitude and observe its direction.

Figure 10:
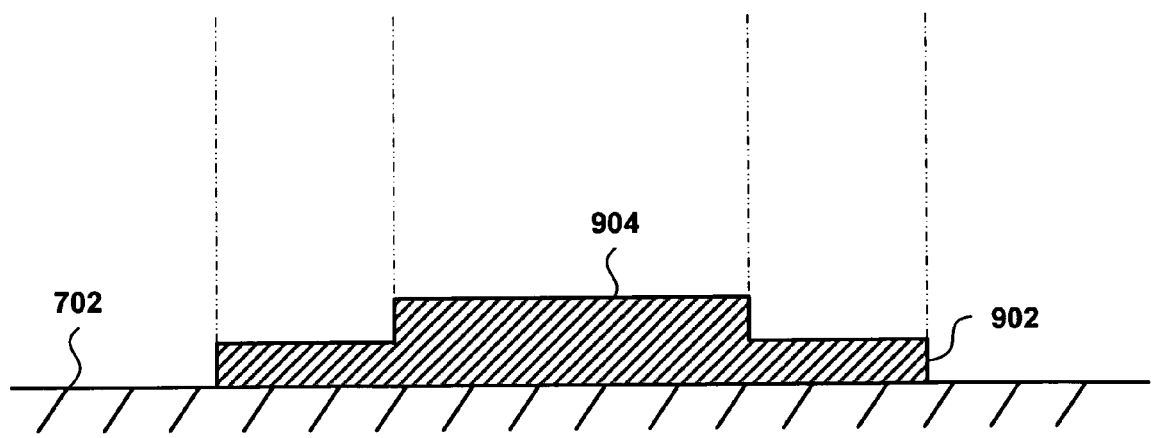
FIG. 10 is a cross-sectional view of the material deposited in FIG. 9.

FIG. 10 is a cross-sectional view of the material deposited in FIG. 9. The back inner side of LCD display 702 serves as the substrate to which the frangible material is deposited. The outer area shown as 902 is deposited in a first pass which is allowed to at least partially cure before the second pass of material 904 is deposited. Once partially or fully cured, an inner area shown as 904 is deposited in a second pass, thus building up the two layers of similar material 902 and 904.

Figure 11:
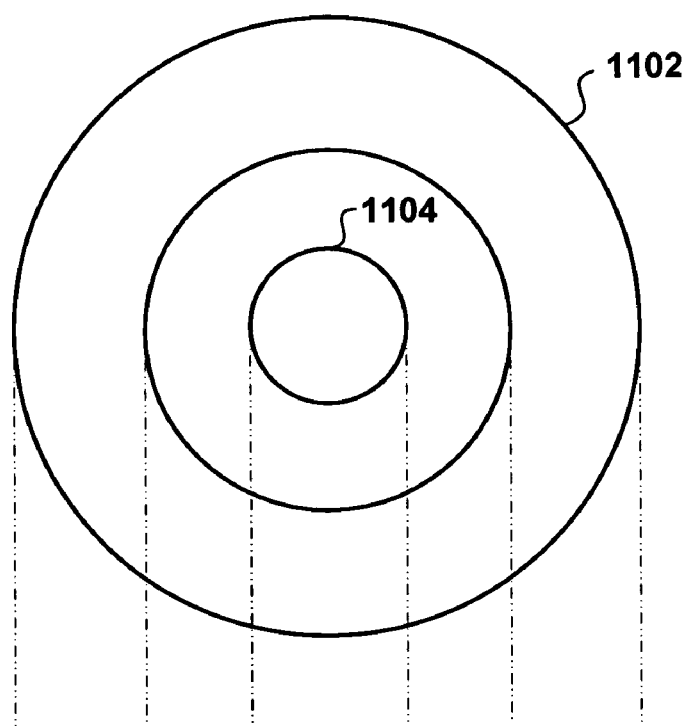
FIG. 11 is an isolated view of the material deposited to the back of the LCD display shown in FIG. 7 as viewed from a point which is perpendicular to the back of the LCD according to one embodiment of the present invention.

FIG. 11 is an isolated view of the material deposited to the back of the LCD display shown in FIG. 7 as viewed from a point which is perpendicular to the back of the LCD according to one embodiment of the present invention. The deposition of material shown in FIG. 11 is applied as two concentric regions 1102 and 1104 of frangible material. Area 1104 is deposited using a frangible material formulation which exhibits a greater breaking threshold than the material used in outer area 1102. This structure is used with frangible materials such as Stresscoat® where the breaking threshold varies little as a function of deposition thickness and where it is desirable to record a broader dynamic range of strain values. When compared against a uniform deposition, having two areas of varying cracking threshold, 1104 and 1102, allows the crack to propagate further, and by virtue of the different thresholds traversed, provide evidence relating to its magnitude and direction.

Figure 12:
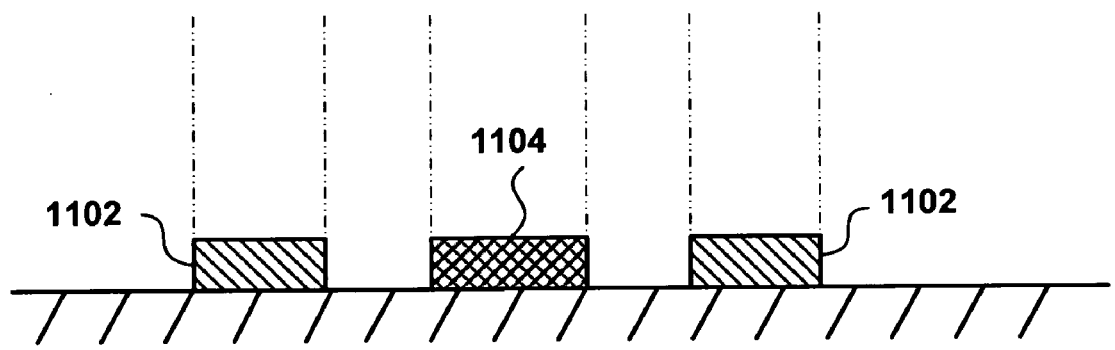
FIG. 12 is a cross-sectional view of the material deposited in FIG. 11.

FIG. 12 is a cross-sectional view of the materials deposited in FIG. 11. The outer area shown as 1102 is deposited with a material having a different breaking threshold than the material used for area 1104.

Figure 13:
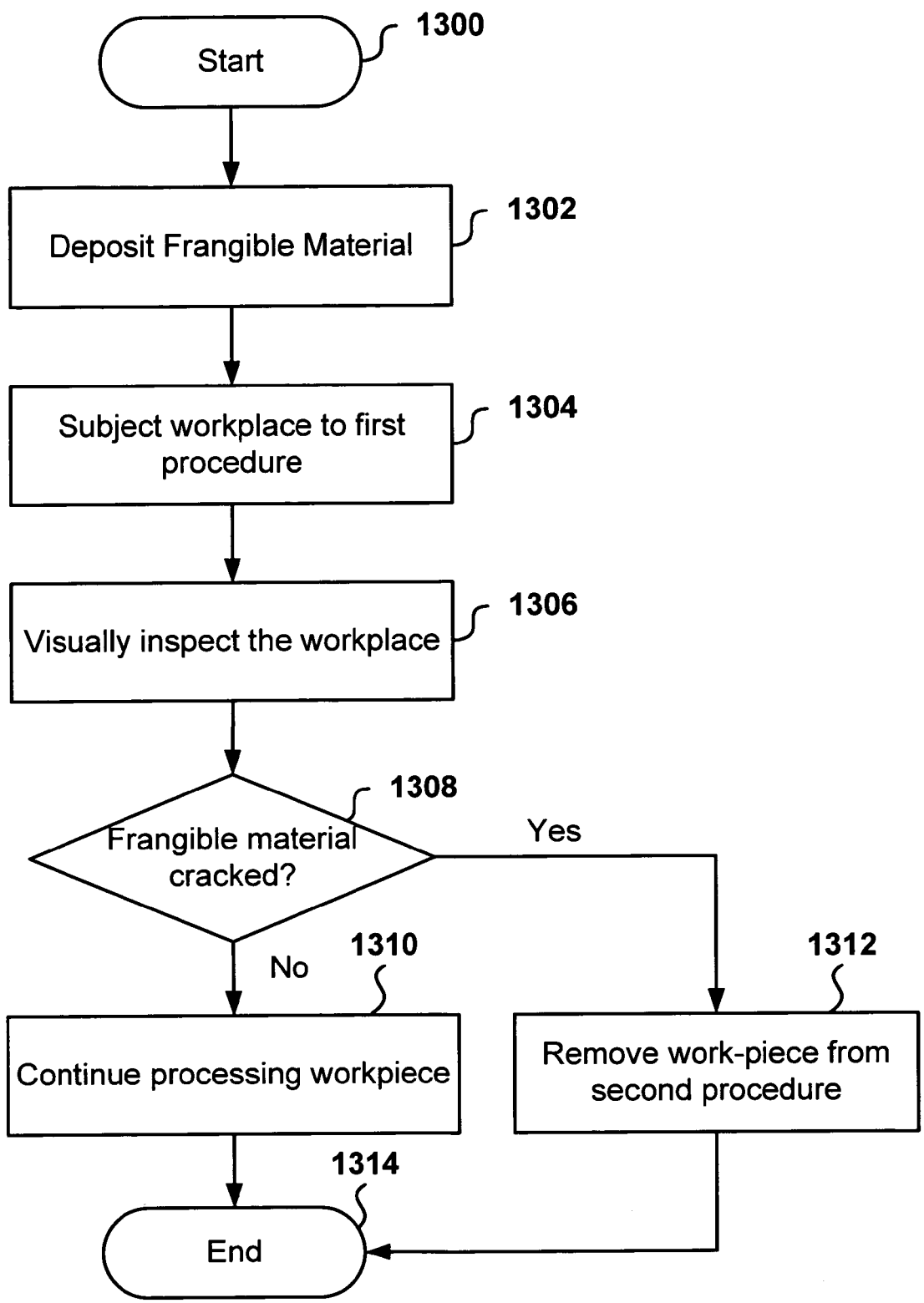
FIG. 13 is a flow diagram of an improved process according to one embodiment of the present invention for manufacturing a workpiece.

Having set forth construction and utility details for a variety of embodiments, further utility details shall now be presented with respect to FIG. 13.

FIG. 13 is a flow diagram of an improved process according to one embodiment of the present invention for manufacturing a workpiece. In the example given in FIG. 13, the workpiece is a printed circuit board substrate as described above in the various embodiments. The workpiece comprises a printed circuit board having components mounted thereon. However, this example is not to be considered limiting upon the invention since the same concepts can be used for manufacturing and testing of all sorts of components. The process begins 1300 by depositing 1302 frangible material on the printed circuit board substrate according to any of the embodiments described in FIGS. 1–12. For example, the frangible material may be deposited approximate to the corners of an area where a component is to be mounted, or, concentric areas centered on or about the maxima or a minima of expected stress may be deposited according to any of the concentric area embodiments described above, etc. The material is then given time to cure. The curing process typically takes 24 hours. The printed circuit board is then subjected 1304 to a mounting procedure or a testing procedure which inflicts stress or strain on the printed circuit board substrate. If the strain inflicted on the substrate is larger than the threshold of the frangible material, the frangible material cracks and the substrate should be removed from further processing without undergoing reprocessing or further testing. At this point in the process, the printed circuit board can be visually inspected 1306 to determine if the frangible material has cracked. If 1308 the material has cracked, the printed circuit board substrate is removed 1312 from further processing without undergoing reprocessing or further testing. The board can be reworked or otherwise tested and be introduced in the process at a later time. If 1308 the visual inspection of the board reveals that the frangible material has not cracked, processing continues 1310 as normal until completion of the manufacturing process 1314.

When the circuit board is removed 1312 from further processing, the direction and strength of the strain endured by a circuit board during the manufacturing or testing process can be readily deduced from the direction and/or the extent of the crack, as previously described. Based on either or both of these deductions, should the number of failures become significant, it is possible and desirable to change either the manufacturing machinery, the testing area, or the design of the circuit board itself to eliminate the source of failure.

In the drawings and specifications there has been set forth a preferred embodiment of the invention and, although specific terms are used, the description thus given uses terminology in a generic and descriptive sense only and not for purposes of limitation.

We claim as our invention:

1. Apparatus comprising:
   a substrate;
   a component mounted on said substrate; and
   a frangible material deposited on a predetermined area of said substrate proximate said component, the predetermined area being smaller than a largest area of said component and surrounded by non frangible material;
   said frangible material having a strain threshold at which the frangible material breaks in response to experiencing a value of strain which is greater than the strain threshold, breakage of said frangible material indicating subjection of the assembly to strain exceeding a determinable standard.

2. Apparatus comprising:
   a substrate;
   component mounted on said substrate; and
   a frangible material deposited on two or more predetermined areas of said substrate proximate said component, each of the predetermined areas being smaller than a largest area of said component and surrounded by non frangible material;
   said frangible material having a strain threshold at which the frangible material breaks in response to experiencing a value of strain which is greater than the strain threshold, breakage of said frangible material indicating subjection of the assembly to strain exceeding a determinable standard.

3. Apparatus of claim 2 wherein said component has corners and the predetermined areas of said substrate are proximal to the corners of said component.

4. Apparatus of claim 3 wherein said component is rectangular and the number of predetermined areas is four corresponding to each of the corners of the rectangular component and wherein each of the four predetermined areas are proximate to one of the four corners.

5. Apparatus of claim 4 wherein each of said predetermined areas having frangible material deposited thereon are located on a side of said substrate which is the side on which said component is mounted.

6. Apparatus of claim 4 wherein each of said predetermined areas having frangible material deposited thereon are located on a side of said substrate which is opposite to the side on which said component is mounted.

7. Apparatus of claim 3 wherein each of the predetermined areas of said substrate proximate each of the corners of said component further comprises:
  a first area of frangible material having a first strain threshold at which the frangible material breaks in response to experiencing a value of strain which is greater than the first strain threshold; and
  a second area of frangible material having a second strain threshold at which the frangible material breaks wherein the second strain threshold is different than the first strain threshold, the second area being isolated and displaced from said first area.

8. Apparatus of claim 7 wherein the second area is located at a distance which is further from a center of said component than said first area.

9. Apparatus of claim 8 further comprising:
  a third area of frangible material having a strain threshold of the same general value as the first threshold and being isolated from said first area such that the third area is displaced radially from said first area relative to the center of said component.

10. Apparatus of claim 2 wherein said substrate is an electronic circuit board.

11. Apparatus comprising:
  a substrate having a predetermined stress area;
  a first partial area of frangible material deposited on said substrate proximate to the predetermined stress area, wherein the first partial area of frangible material is deposited with a first thickness; and
  a second area of frangible material which occupies a smaller area than said first partial area and is deposited within the confines of said first partial area, wherein the second area of frangible material is deposited with a second thickness which is greater than the first thickness;
  said first area of frangible material having a first strain threshold at which the frangible material breaks in response to experiencing a value of strain which is greater than the first strain threshold;
  said second area of frangible material having a second strain threshold at which the frangible material breaks wherein the second strain threshold is different than the first strain threshold;
  breakage of said frangible material indicating subjection of the assembly to strain exceeding determinable standards.

12. Apparatus of claim 11 wherein said first partial area and said second partial area are each generally circular in shape.

13. Apparatus of claim 12 wherein said first and second partial areas are generally concentric.

14. Apparatus comprising:
  a substrate having a predetermined stress area;
  a first partial area of frangible material deposited on said substrate proximate to the predetermined stress area, wherein the first partial area of frangible material is deposited with frangible material having a first breaking threshold; and
  a second area of frangible material which occupies a smaller area than said first partial area and is deposited within the confines of said first partial area, wherein the second area of frangible material is deposited with frangible material having a second breaking threshold which is different than the first breaking threshold;
  breakage of said frangible material indicating subjection of the assembly to strain exceeding determinable standards.

15. Apparatus comprising:
  a flexible component having a predetermined stress area;
  a first area of frangible material deposited at the location of the predetermined area, wherein the first area of frangible material is deposited with a first thickness, is smaller than a largest area of said flexible component, and is surrounded by non frangible material; and
  a second area of frangible material which occupies a smaller area than said first area and is deposited within the confines of said first area, wherein the second area of frangible material is deposited with a second thickness which is greater than the first thickness
  said first area of frangible material having a first strain threshold at which the frangible material breaks in response to experiencing a value of strain which is greater than the first strain threshold;
  said second area of frangible material having a second strain threshold at which the frangible material breaks wherein the second strain threshold is different than the first strain threshold;
  breakage of said frangible material indicating subjection of the assembly to strain exceeding determinable standards.

16. Apparatus comprising:
  a flexible component having a predetermined stress area;
  frangible material deposited on the predetermined area of said flexible component, the predetermined area being smaller than a largest area of said component and surrounded by non frangible material;
  said frangible material having a strain threshold at which the frangible material breaks in response to experiencing a value of strain which is greater than the strain threshold, breakage of said frangible material indicating subjection of the assembly to strain exceeding a determinable standard.

* * * * *